(12) United States Patent
Kim

(10) Patent No.: US 7,682,976 B2
(45) Date of Patent: Mar. 23, 2010

(54) METHODS OF FORMING A PHASE-CHANGE MATERIAL LAYER PATTERN, METHODS OF MANUFACTURING A PHASE-CHANGE MEMORY DEVICE AND RELATED SLURRY COMPOSITIONS

(75) Inventor: Jong-Young Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/292,842

(22) Filed: Nov. 26, 2008

(65) Prior Publication Data
US 2009/0149006 A1 Jun. 11, 2009

(30) Foreign Application Priority Data
Dec. 11, 2007 (KR) .................. 10-2007-0128365

(51) Int. Cl.
*H01L 21/302* (2006.01)
(52) U.S. Cl. .................. 438/692; 438/102; 438/631; 438/637; 257/E21.23; 257/E21.303; 257/E21.304
(58) Field of Classification Search ............. 438/645; 257/E21.483, E31.029
See application file for complete search history.

(56) References Cited
U.S. PATENT DOCUMENTS
5,166,758 A 11/1992 Ovshinsky et al.
5,825,046 A 10/1998 Czubatyj et al.
2007/0008774 A1* 1/2007 Khang .................. 365/163
2008/0190035 A1* 8/2008 Lu et al. .................. 51/307

FOREIGN PATENT DOCUMENTS
| JP | 2005-032855 | 2/2005 |
|---|---|---|
| JP | 2005-123482 | 5/2005 |
| JP | 2006-270066 | 10/2006 |
| KR | 10-2003-0081900 | 10/2003 |
| KR | 10-2004-0100499 | 12/2004 |
| KR | 10-0681266 | 2/2007 |

* cited by examiner

*Primary Examiner*—Savitri Mulpuri
*Assistant Examiner*—Cheung Lee
(74) *Attorney, Agent, or Firm*—Harness, Dickey & Pierce, P.L.C.

(57) ABSTRACT

In methods of forming a phase-change material layer pattern, an insulation layer having a recessed portion may be formed on a substrate, and a phase-change material layer may be formed on the insulation layer to fill the recessed portion. A first polishing process may be performed on the phase-change material layer using a first slurry composition to partially remove the phase-change material layer, the first slurry composition having a first polishing selectivity between the insulation layer and the phase-change material layer. A second polishing process may be performed on the phase-change material layer using a second slurry composition to form a phase-change material layer pattern in the recessed portion, the second slurry composition having a second polishing selectivity substantially lower than the first polishing selectivity.

20 Claims, 7 Drawing Sheets

METHODS OF FORMING A PHASE-CHANGE MATERIAL LAYER PATTERN, METHODS OF MANUFACTURING A PHASE-CHANGE MEMORY DEVICE AND RELATED SLURRY COMPOSITIONS

BACKGROUND

1. Field

Example embodiments relate to methods of forming a phase-change material layer pattern, methods of manufacturing a phase-change memory device and related slurry compositions. More particularly, example embodiments relate to methods of forming a phase-change material layer pattern using a chemical mechanical polishing (CMP) process, methods of manufacturing a phase-change memory device and related slurry compositions.

2. Description of the Related Art

Semiconductor memory devices may be generally divided into volatile semiconductor memory devices, e.g., dynamic random access memory (DRAM) devices or static random access memory (SRAM) devices, and non-volatile semiconductor memory devices, e.g., flash memory devices or electrically erasable programmable read only memory (EEPROM) devices. The volatile semiconductor memory device loses data stored therein when the power is turned off. However, the non-volatile semiconductor memory device retains stored data even if the power is turned off.

Among the non-volatile semiconductor memory devices, the flash memory device has been widely employed in various electronic apparatuses, e.g., a digital camera, a cellular phone, and an MP3 player. Because a programming process and a reading process of the flash memory device take a relatively long time, however, technologies to manufacture a semiconductor memory device, for example, a magnetic random access memory (MRAM) device, a ferroelectric random access memory (FRAM) device or a phase-change random access memory (PRAM) device, have been steadily developed.

The phase-change memory device stores information using a resistance difference between an amorphous phase and a crystalline phase of a phase-change material layer composed of a chalcogenide compound, e.g., germanium-antimony-tellurium (GST). Particularly, the PRAM device may store data as states of "0" and "1" using a reversible phase transition of the phase-change material layer. The amorphous phase of the phase-change material layer may have a relatively large resistance, whereas the crystalline phase of the phase-change material layer may have a relatively small resistance.

In the PRAM device, a transistor formed on a substrate may provide the phase-change material layer with a reset current (Ireset) for changing the phase of the phase-change material layer from the crystalline state into the amorphous state. The transistor may also supply the phase-change material layer with a set current (Iset) for changing the phase of the phase-change material layer from the amorphous state into the crystalline state.

In a method of manufacturing a PRAM device, a phase-change material layer pattern may be formed by dry-etching a phase-change material layer which is formed by a deposition process using a chalcogenide compound. However, while the phase-change material layer is patterned by a dry etching process, the phase-change material layer may be damaged by etching plasma, and the damaged portion of the phase-change material layer may generate an operational defect of the PRAM device, e.g., an error of storing data.

SUMMARY

Example embodiments provide methods of forming a phase-change material layer pattern that may have enhanced electrical characteristics. Example embodiments also provide methods of manufacturing a phase-change memory device using the above-mentioned methods. Example embodiments still also provide slurry compositions for polishing a phase-change material layer that may be employed in the above-mentioned methods.

According to example embodiments, there may be provided a method of forming a phase-change material layer pattern. In the method, an insulation layer having a recessed portion may be formed on a substrate, and a phase-change material layer may be formed on the insulation layer to fill the recessed portion. A first polishing process may be performed on the phase-change material layer using a first slurry composition to partially remove the phase-change material layer, the first slurry composition having a first polishing selectivity between the insulation layer and the phase-change material layer. A second polishing process may be performed on the phase-change material layer using a second slurry composition to form a phase-change material layer pattern in the recessed portion, the second slurry composition having a second polishing selectivity substantially lower than the first polishing selectivity.

In example embodiments, the first polishing selectivity between the insulation layer and the phase-change material layer may be in a range of about 1:5 to about 1:1,000. In example embodiments, the second polishing selectivity between the insulation layer and the phase-change material layer may be in a range of about 1:0.5 to about 1:2.

In example embodiments, performing the second polishing process may further include removing a surface oxide layer from the phase-change material layer where the first polishing process may be performed, the surface oxide layer being formed by oxidizing a surface of the phase-change material layer with the first slurry composition.

In example embodiments, the first slurry composition may include a first inorganic abrasive, a first oxidizing agent, a first organic acid and a first solvent, and the second slurry composition may include a second inorganic abrasive, a second oxidizing agent, a second organic acid, an azole compound and a second solvent.

In example embodiments, the first slurry composition may include the first inorganic abrasive in a range of about 0.1 to about 2% by weight, and the second slurry composition may include the second inorganic abrasive in a range of about 2.1 to about 5% by weight.

In example embodiments, the first slurry composition may include the first oxidizing agent in a range of about 0.12 to about 5% by weight, and the second slurry composition may include the second oxidizing agent in a range of about 0.01 to about 0.5% by weight.

In example embodiments, the first slurry composition may have a polishing rate of the insulation layer in a range of about 1 to about 250 Å/min, and the second slurry composition may have a polishing rate of the insulation layer in a range of about 300 to about 1,000 Å/min.

In example embodiments, the first slurry composition may have a polishing rate of the phase-change material layer in a range of about 1,000 to about 100,000 Å/min, and the second slurry composition may have a polishing rate of the phase-change material layer in a range of about 150 to about 1,000 Å/min.

In example embodiments, the insulation layer may be formed using silicon oxide, silicon oxynitride, silicon nitride, or a combination thereof. In example embodiments, the phase-change material layer may be formed using a chalcogenide compound.

In example embodiments, forming the insulation layer having the recessed portion may include forming a lower electrode on the substrate, forming the insulation layer on the lower electrode, and partially removing the insulation layer to form a contact hole in the insulation layer, the contact hole exposing the lower electrode. In example embodiments, an upper electrode may be formed on the phase-change material layer pattern.

In example embodiments, forming the insulation layer having the recessed portion may include forming a diode on the substrate, forming the insulation layer on the diode, and partially removing the insulation layer to form an opening in the insulation layer, the opening exposing the diode.

In example embodiments, the first slurry composition may include a first inorganic abrasive in an amount substantially less than an amount of a second inorganic abrasive included in the second slurry composition. In example embodiments, the second polishing process may be performed with a polishing rate of the insulation layer substantially faster than a polishing rate of the insulation layer in the first polishing process.

In example embodiments, performing the first polishing process may include removing a bulk portion of the phase-change material layer on an upper surface of the insulation layer until a portion of the phase-change material layer remains on the upper surface of the insulation layer, and performing the second polishing process may include removing the surface oxide layer and a remaining portion of the phase-change material layer on the upper surface of the insulation layer until the upper surface of the insulation layer is exposed.

In example embodiments, performing the first polishing process may include removing a bulk portion of the phase-change material layer on an upper surface of the insulation layer until at least a portion of the insulation layer is exposed, and performing the second polishing process comprises removing the surface oxide layer, a portion of the phase-change material layer, and a portion of the insulation layer until the upper surface of the insulation layer is fully exposed.

According to example embodiments, a slurry composition for polishing a phase-change material layer of a phase-change memory device, may include about 2.1 to about 5% by weight of an inorganic abrasive, about 0.01 to about 0.5% by weight of an oxidizing agent, about 0.1 to about 5% by weight of an azole compound, and a remainder of a solvent.

According to example embodiments, a phase-change material layer pattern may be formed by performing two different polishing processes in which a first slurry composition having a higher selectivity and a second slurry composition having a lower selectivity may be sequentially employed. Accordingly, as compared with performing one polishing process using only the first polishing process, a formation of an unintended recess in an upper portion of the phase-change material layer pattern may be prevented or reduced. Further, a polishing efficiency may be enhanced by removing a bulk portion of the phase-change material layer with the first slurry composition having a higher polishing rate of the phase-change material layer, as compared with performing one polishing process using only the second slurry composition having a lower selectivity and a lower polishing rate of the phase-change material layer.

Additionally, when the phase-change material layer pattern is formed by performing one polishing process using only the first slurry composition, an unintended thick surface oxide layer may be formed on the phase-change material layer pattern because the first slurry composition may have a relatively low polishing rate of an insulation layer (including a surface oxide layer). Oxygen of the surface oxide layer may also diffuse into the phase-change material layer pattern to deteriorate electrical characteristics relating to phase transition of the phase-change material layer pattern. However, the second slurry composition, which may have a relatively increased polishing rate of the insulation layer, may rapidly remove the surface oxide layer from the phase-change material layer and may also suppress a formation of such a surface oxide layer. Therefore, electrical characteristics of the phase-change material layer pattern may be improved and a generation of a defect in a phase-change memory device may be reduced.

BRIEF DESCRIPTION OF THE DRAWINGS

Example embodiments will be more clearly understood from the following detailed description taken in conjunction with the accompanying drawings. FIGS. 1-4C represent non-limiting, example embodiments as described herein.

FIG. 1 is a flow chart illustrating a method of forming a phase-change material layer pattern in accordance with example embodiments;

FIGS. 3A-3F and FIGS. 4A-4C are cross-sectional views illustrating a method of manufacturing a phase-change memory device in accordance with example embodiments.

Figure 1:
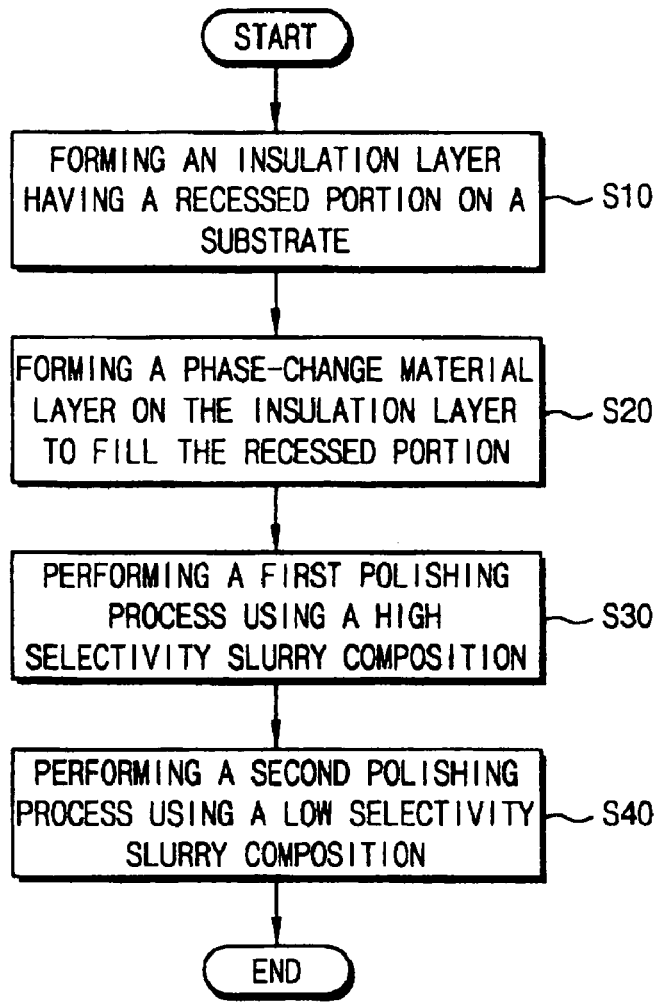

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

This application claims priority under 35 USC §119 to Korean Patent Application No. 2007-128365, filed on Dec. 11, 2007 in the Korean Intellectual Property Office (KIPO), the entire contents of which are incorporated herein by reference.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 2A:
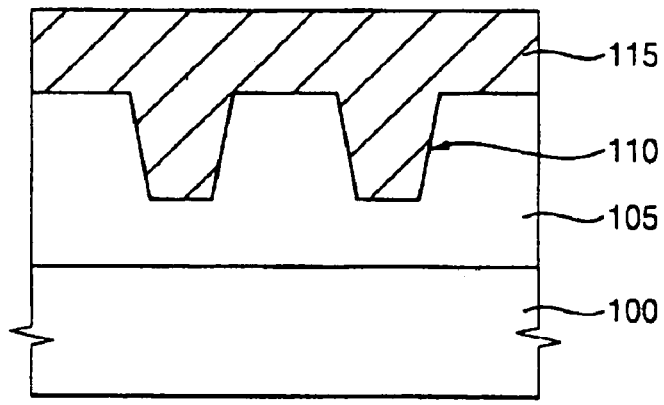
FIGS. 2A-2C are cross-sectional views illustrating a method of forming a phase-change material layer pattern in accordance with example embodiments.
Figure 2B:
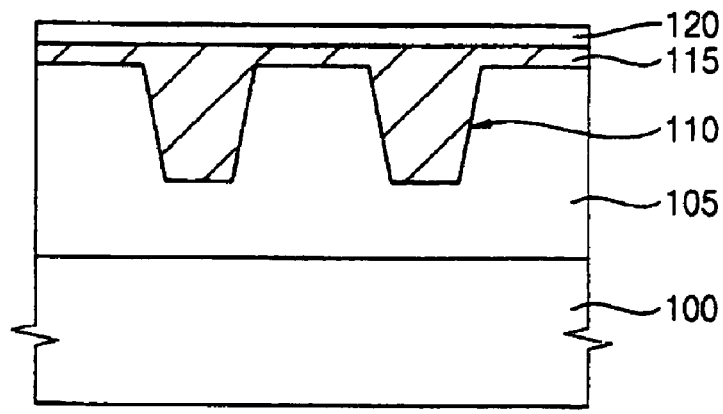
Figure 2C:
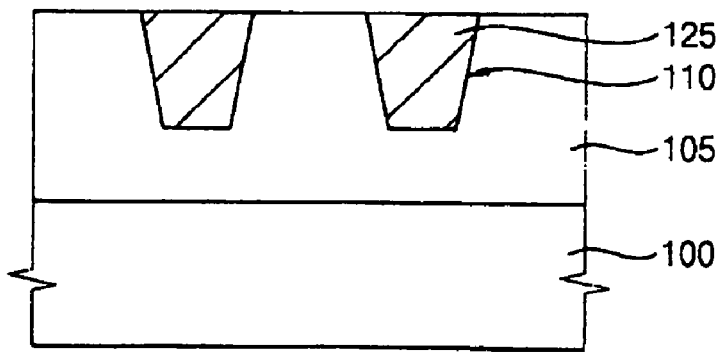

FIG. 1 is a flow chart illustrating a method of forming a phase-change material layer pattern in accordance with example embodiments, and FIGS. 2A-2C are cross-sectional views illustrating a method of forming a phase-change material layer pattern in accordance with example embodiments.

Referring to FIGS. 1 and 2A, an insulation layer 105 having a recessed portion 110 may be formed on a substrate 100 in S10. The substrate 100 may be a semiconductor substrate or a single crystalline metal oxide substrate. For example, the substrate 100 may be a silicon substrate, a germanium substrate, a silicon-on-insulator (SOI) substrate, a single crystalline aluminum oxide substrate, or a single crystalline strontium titanium oxide substrate.

In example embodiments, a contact region (not illustrated) having doped impurities may be formed on the substrate 100. Further, lower structures (not illustrated), e.g., conductive layer patterns, insulation layer patterns, pads, electrodes, spacers, gate structures and/or transistors, may be formed on the substrate 100.

The insulation layer 105 may be formed on the substrate 100 to cover the contact region and/or the lower structure. The insulation layer 105 may be formed using an insulation material, e.g., silicon oxide, silicon oxynitride, silicon nitride, metal oxide or combinations thereof. Examples of silicon oxide that may be used in forming the insulation layer 105 may include borophosphosilicate glass (BPSG), phosphosilicate glass (PSG), undoped silicate glass (USG), spin-on-glass (SOG), tetraethyl orthosilicate (TEOS), plasma-enhanced tetraethyl orthosilicate (PE-TEOS), or high density plasma chemical vapor deposition (HDP-CVD) oxide. These may be used alone or in a combination thereof. The insulation layer 105 may be formed by a chemical vapor deposition (CVD) process, a low pressure chemical vapor deposition (LPCVD) process, a plasma enhanced chemical vapor deposition (PECVD) process, or an HDP-CVD process.

The recessed portion 110 of the insulation layer 105 may have an upper surface substantially lower than an upper surface of the insulation layer 105. The recessed portion 110 may include an opening or a contact hole, which may expose a portion of the substrate 100, e.g., the contact region or the lower structure on the substrate 100. The recessed portion 110 may be formed by partially etching the insulation layer 105. In example embodiments, a photoresist pattern (not illustrated) may be formed on the insulation layer 105, and the insulation layer 105 may be partially etched using the photoresist pattern as an etching mask to form the recessed portion 110 in the insulation layer 105.

Referring to FIGS. 1 and 2A, a phase-change material layer 115 may be formed on the insulation layer 105 to fill the recessed portion 110 in S20. The phase-change material layer 115 may be formed using a phase-change material, e.g., a chalcogenide compound. For example, the phase-change material layer 115 may be formed by a CVD process and/or a sputtering process. The chalcogenide compound denotes a material including at least one chalcogen ion, e.g., tellurium (Te) ion, selenium (Se) ion and/or sulfur (S) ion, and at least one more electropositive element. Non-limiting examples of the chalcogenide compound may include germanium-antimony-tellurium (Ge—Sb—Te; GST), germanium-selenium-tellurium (Ge—Se—Te), tin-selenium-tellurium (Sn—Se—Te), tin-antimony-tellurium (Sn—Sb—Te), tin-arsenic-selenium (Sn—As—Se), arsenic-germanium-antimony-tellurium (As—Ge—Sb—Te), arsenic-germanium-selenium-tellurium (As—Ge—Se—Te), and germanium-antimony-selenium-tellurium (Ge—Sb—Se—Te). These may be used alone or in a combination thereof.

In example embodiments, the phase-change material layer 115 may be formed using a chalcogenide compound doped with carbon, nitrogen and/or a stabilizing metal. Non-limiting examples of the stabilizing metal may include titanium (Ti), nickel (Ni), zirconium (Zr), molybdenum (Mo), ruthenium (Ru), palladium (Pd), hafnium (Hf), tantalum (Ta), iridium (Ir) and/or platinum (Pt). These may be used alone or in a combination thereof.

Referring to FIGS. 1 and 2B, a first polishing process may be performed on the phase-change material layer 115 using a first slurry composition having relatively high polishing selectivity in S30. The first slurry composition may have a relatively high polishing selectivity for the phase-change material layer 115 relative to the insulation layer 105. The first slurry composition may have a removal rate of the phase-change material layer 115 substantially faster than a removal rate of the insulation layer 105. Accordingly, the first slurry composition may rapidly remove the phase-change material layer 115 using the insulation layer 105 as a polishing stop layer. In the first polishing process, an upper portion or a bulk portion of the phase-change material layer 115, which is formed on an upper surface of the insulation layer 105, may be removed. In example embodiments, the first polishing process may be performed until the upper surface of the insulation layer 105 is partially or fully exposed. In example embodiments, the first polishing process may be performed until the upper surface of the insulation layer 105 is not exposed and/or a portion of the phase-change material layer 115 may remain on the insulation layer 105.

In example embodiments, the first slurry composition that may be used in the first polishing process may have a polishing selectivity between the insulation layer 105 and the phase-change material layer 115 in a range of about 1:5 to about 1:1,000. In example embodiments, when the first slurry composition has a polishing selectivity substantially higher than about 1:5, a process time needed for removing the phase-change material layer 115 may be reduced and a process efficiency may be improved. In example embodiments, when the first slurry composition has a polishing selectivity substantially lower than about 1:5, the insulation layer 105 may not properly function as a polishing stop layer. In example embodiments, when the first slurry composition has a polishing selectivity substantially higher than about 1:1,000, a polishing rate or a removal rate of the phase-change material layer 115 may not be adequately controlled.

In example embodiments, the first slurry composition used in the first polishing process may include an inorganic abrasive, an oxidizing agent, an organic acid and a solvent. In example embodiments, the first slurry composition may include about 0.1 to about 2% by weight of the inorganic abrasive, about 0.12 to about 5% by weight of the oxidizing agent, about 0.1 to about 5% by weight of the organic acid and a remainder (e.g., about 88-99.68% by weight) of the solvent.

Non-limiting examples of the inorganic abrasive that may be included in the first slurry composition may include silica, alumina, ceria, zirconia, titania or combinations thereof. In example embodiments, the inorganic abrasive may have a mean diameter in a range of about 5 nm to about 1,000 nm. In example embodiments, the inorganic abrasive may have a mean diameter in a range of about 10 nm to about 500 nm.

When the first slurry composition includes less than about 0.1% by weight of the inorganic abrasive in example embodiments, a removal rate or a polishing rate of the phase-change material layer 115 may decrease, so a polishing efficiency may also decrease. When the first slurry composition includes greater than about 2% by weight of the inorganic abrasive in example embodiments, a removal rate or a polishing rate of the insulation layer 105 may increase, so the insulation layer 105 may not be used as a polishing stop layer. Accordingly, in example embodiments, the first slurry composition may include about 0.1 to about 2% by weight of the inorganic abrasive, and in example embodiments, the first slurry composition may include about 0.1 to about 1.8% by weight of the inorganic abrasive.

Non-limiting examples of the oxidizing agent that may be included in the first slurry composition may include hydrogen peroxide, potassium iodate ($KIO_3$), percarbonate, benzoyl peroxide, peracetic acid, di-t-butyl peroxide, monopersulfate, dipersulfate, sodium peroxide, periodic acid, periodate salt, perbromic acid, perbromate salt, perchloric acid, perchlorate salt, perboric acid, perborate salt, permanganate and/or combinations thereof. When the first slurry composition includes about 0.12% by weight of the oxidizing agent in example embodiments, a polishing rate or a removal rate of the phase-change material layer 115 may decrease, so a polishing efficiency may also decrease. Accordingly, in example embodiments, the first slurry composition may include greater than about 0.12% by weight of the oxidizing agent. In example embodiments, the first slurry composition may include about 0.15 to about 5% by weight of the oxidizing agent.

The first slurry composition may include an organic acid, e.g., a carboxylic acid. The organic acid may improve a polishing rate of the first slurry composition and may stabilize the oxidizing agent included in the slurry composition. Non-limiting examples of the organic acid that may be used in the first slurry composition may include citric acid, malonic acid, acetic acid, glutaric acid, glycolic acid, formic acid, lactic acid, malic acid, maleic acid, oxalic acid, phthalic acid, succinic acid, and tartaric acid. These may be used alone or in a combination thereof. The amount of the organic acid included in the first slurry composition may be adjusted to improve stability of the oxidizing agent and dispersibility of the inorganic abrasive. For example, the amount of the organic acid may be in a range of about 0.1 to about 5% by weight.

The first slurry composition may include an aqueous solvent, e.g., pure water or deionized water. The amount of the solvent may be adjusted considering the concentrations of the inorganic abrasive, the oxidizing agent and/or the organic acid, and dispersibilities of components. For example, the first slurry composition may include a solvent in a range of about 88 to about 99.68% by weight or in a range of about 88.2 to about 99.65% by weight.

In example embodiments, the first slurry composition may include a pH-controlling agent. Non-limiting examples of the pH-controlling agent may include an inorganic acid (e.g., sulfuric acid, hydrochloric acid, phosphoric acid or nitric acid), an organic acid (e.g., carboxylic acid), and a basic solution (e.g., ammonium hydroxide, potassium hydroxide or sodium hydroxide). These may be used alone or in a combination thereof. In example embodiments, the first slurry composition may have a pH of about 2.0 to about 6.0.

In example embodiments, the first slurry composition may show a polishing rate or a removal rate of the insulation layer 105 (e.g., an oxide layer) in a range of about 1 to about 250 Å/min, and the phase-change material layer 115 (e.g., a chalcogenide layer) in a range of about 1,000 to about 100,000 Å/min. In example embodiments, when the amount of the inorganic abrasive included in the first slurry composition is greater than about 2% by weight and accordingly the polishing rate of the insulation layer 105 may exceed about 250 Å/min, the insulation layer 105 may not be used as a polishing stop layer of the first polishing process and the insulation layer 105 may be damaged or removed by the first slurry composition. In example embodiments, when the first slurry composition may include less than about 0.12% by weight of the oxidizing agent and accordingly the polishing rate of the phase-change material layer 115 may be lower than about 1,000 Å/min, a polishing efficiency of the first polishing process may be reduced.

A bulk portion of the phase-change material layer 115 may be removed by performing the first polishing process on the phase-change material layer 115 using the above-mentioned first slurry composition.

Referring to FIG. 2B, after the phase-change material layer 115 is partially removed by performing the first polishing process, a surface oxide layer 120 may be formed on an upper surface of the phase-change material layer 115. The surface oxide layer 120 may include an oxide of a chalcogenide, which may be formed by oxidizing a surface of the phase-change material layer 115 with the first slurry composition. When an upper electrode is formed on the phase-change material layer 115 in a subsequent process, the surface oxide layer 120 may increase electrical resistance at an interface between the phase-change material layer and the upper electrode and may also cause a defect of a phase-change memory device. Oxygen of the surface oxide layer 120 may readily move into the phase-change material layer 115 to cause deterioration of electrical characteristics relating to phase transition. Accordingly, electrical characteristics of the phase-change memory device may be improved by removing the surface oxide layer 120 from the phase-change material layer 115.

Referring to FIGS. 1 and 2C, a second polishing process may be performed on a remaining portion of the phase-change material layer 115 using a second slurry composition in S40. The second polishing process may be carried out until an upper surface of the insulation layer 105 is exposed. Accordingly, the portion of the phase-change material layer 115 remaining on the insulation layer 105 and the surface oxide layer 120 may be removed from the substrate 100, and a phase-change material layer pattern 125 may be formed to fill the recessed portion 110.

In example embodiments, the second slurry composition that may be used in the second polishing process may have a polishing selectivity between the insulation layer 105 and the phase-change material layer 115 in a range of about 1:0.5 to about 1:2. In example embodiments, when the second slurry composition has a polishing selectivity lower than about 1:0.5, the insulation layer 105 may be excessively removed as compared with the phase-change material layer 115 and an unintended recess may be generated in an upper face of the insulation layer 105. In example embodiments, when the polishing selectivity of the second slurry composition exceeds about 1:2, an unintended recess may be formed in an upper face of the phase-change material layer pattern 125 due to a relatively rapid polishing rate of the phase-change material layer 115, and accordingly, a defect of a phase-change memory device may be generated. The second slurry composition may have a relatively low polishing selectivity, and thus the second slurry composition may evenly or uniformly remove by polishing both the insulation layer 105 and the phase-change material layer 115. Further, the second slurry composition may have an improved polishing rate of an insulation material relative to the first slurry composition, and thus, the surface oxide layer 120 may be readily removed from the substrate in the second polishing process.

In example embodiments, the second slurry composition used in the second polishing process may include an inorganic abrasive, an oxidizing agent, an organic acid, an azole compound and a solvent. For example, the second slurry composition may include about 2.1 to about 5% by weight of the inorganic abrasive, about 0.01 to about 0.5% by weight of the oxidizing agent, about 0.1 to about 5% by weight of the organic acid, about 0.01 to about 10% by weight of the azole compound and a remainder of a solvent. Examples of the inorganic abrasive, the oxidizing agent, the organic acid and the solvent that may be used in the second slurry composition may be substantially the same as those used in the first slurry composition, so any further explanations in this regard will be omitted herein.

In example embodiments, when the second slurry composition includes less than about 2.1% by weight of the inorganic abrasive, a polishing rate of the insulation layer 105 may be excessively slow and a polishing rate of the phase-change material layer 115 may be relatively fast. Accordingly, an unintended recess may be generated in the phase-change material layer pattern 125 and the surface oxide layer 120 may not be readily removed from the phase-change material layer 115. In example embodiments, when the second slurry composition includes greater than about 5% by weight of the inorganic abrasive, the polishing rate of the insulation layer 105 may be so fast that the second polishing process may not be properly controlled and/or a polishing stop point may not be readily determined. Accordingly, in example embodiments, the second slurry composition may include the inorganic abrasive in a range of about 2.1 to about 5% by weight, and in example embodiments, the second slurry composition may include about 2.2 to about 5% by weight of the inorganic abrasive.

In example embodiments, when the second slurry composition includes less than about 0.01% by weight of the oxidizing agent, a composition of the phase-change material layer pattern 125 formed by performing the second polishing process may be non-uniform. For example, when the second slurry composition has such a small amount of the oxidizing agent, reactivity difference to the components of the phase-change material layer 115 (e.g., germanium, antimony and tellurium) may increase. As a result, the phase-change material layer pattern 125 formed of GST may have a relatively small amount of germanium and a relatively large amount of tellurium after performing the second polishing process. Thus, phase transition characteristics of the phase-change material layer pattern 125 may be deteriorated. In example embodiments, when the second slurry composition includes greater than about 0.5% by weight of the oxidizing agent, an unintended surface oxide layer may be formed on the phase-change material layer pattern 125 to increase contact resistance between the phase-change material layer pattern 125 and an upper electrode which may be formed on the phase-change material layer pattern 125. Accordingly, in example embodiments, the second slurry composition may include the oxidizing agent in a range of about 0.01 to about 0.5% by weight.

The second slurry composition may include a polishing-inhibition agent to reduce a polishing rate of the phase-change material layer 115. The second slurry composition may include an azole compound as the polishing-inhibition agent. The azole compound may reduce a polishing rate or removal rate of the phase-change material layer 115, and may not have a substantial influence on a polishing rate of the insulation layer 105. Therefore, the azole compound may reduce a polishing selectivity of the phase-change material layer 115 relative to the insulation layer 105. Non-limiting examples of the azole compound that may be used in the second slurry composition may include triazole, benzotriazole, imidazole, tetrazole, thiazole, oxazole, pyrazole or combinations thereof. The amount of the azole compound may be properly adjusted to obtain a predetermined or given polishing selectivity. In example embodiments, the amount of the azole compound may be in a range of about 0.01 to about 10% by weight. In example embodiments, the amount of the azole compound may be in a range of about 0.05 to about 1% by weight.

The amount of the organic acid that may be included in the second slurry composition may be adjusted to improve stability of the oxidizing agent and dispersibility of the inorganic abrasive. As an example, the amount of the organic acid may be from about 0.1 to about 5% by weight. The amount of the solvent included in the second slurry composition may be adjusted considering concentrations of dispersibilities of components. For example, the amount of the solvent (e.g., water) may be from about 79.5 to about 97.78% by weight, or from about 88.5 to about 97.64% by weight. Further, the second slurry composition may additionally include a pH-controlling agent. For example, the second slurry composition may be adjusted to have a pH of about 2.0 to about 6.0. Examples of the pH-controlling agent may be substantially the same as those of the pH-controlling agent used in the first slurry composition.

In example embodiments, the second slurry composition may have a polishing rate or a removal rate of the insulation layer 105 (e.g., formed of an oxide) in a range of about 300 to about 1,000 Å/min, and may have a polishing rate or a removal rate of the phase-change material layer 115 (e.g., formed of a chalcogenide) in a range of about 150 to about 1,000 Å/min. As compared with the first slurry composition, the second slurry composition may have a decreased polishing rate of the phase-change material layer 115 and/or an increased polishing rate of the insulation layer 105. For example, with respect to the polishing rate of the phase-change material layer 115, the polishing rate of the second slurry composition may be lower than the polishing rate of the first slurry composition. With respect to the polishing rate of the insulation layer 105, the polishing rate of the second slurry composition may be higher than the polishing rate of the first slurry composition.

The second polishing process may be performed on the phase-change material layer 115 using the above-mentioned second slurry composition until the upper face of the insulation layer 105 may be exposed. Accordingly, the surface oxide layer 120 may be removed from the phase-change material layer 115, and the phase-change material layer pattern 125 may be formed to fill the recessed portion 110 of the insulation layer 105.

The phase-change material layer pattern 125 may be formed by performing two different polishing processes in which the first slurry composition having a relatively high selectivity and the second slurry composition having a relatively low selectivity may be sequentially used. Accordingly, an excessive polishing of the phase-change material layer 115, which may be induced by the first slurry composition having a relatively high polishing rate to the phase-change material layer 115, may be suppressed or reduced, and thus, a formation of an unintended recess in an upper portion of the phase-change material layer pattern 125 may be prevented or reduced. Further, high polishing efficiency may also be obtained by removing a bulk portion of the phase-change material layer 115 with the first slurry composition having a relatively high polishing rate to the phase-change material layer 115. Additionally, a formation of an unintended thick surface oxide layer on the phase-change material layer pattern 125 may be reduced or prevented, because the second polishing process may be performed using the second slurry composition having a relatively increased polishing rate of an insulation material. Therefore, electrical characteristics of the phase-change material layer pattern 125 may be improved and a generation of a defect in a phase-change memory device may be reduced.

Figure 3A:
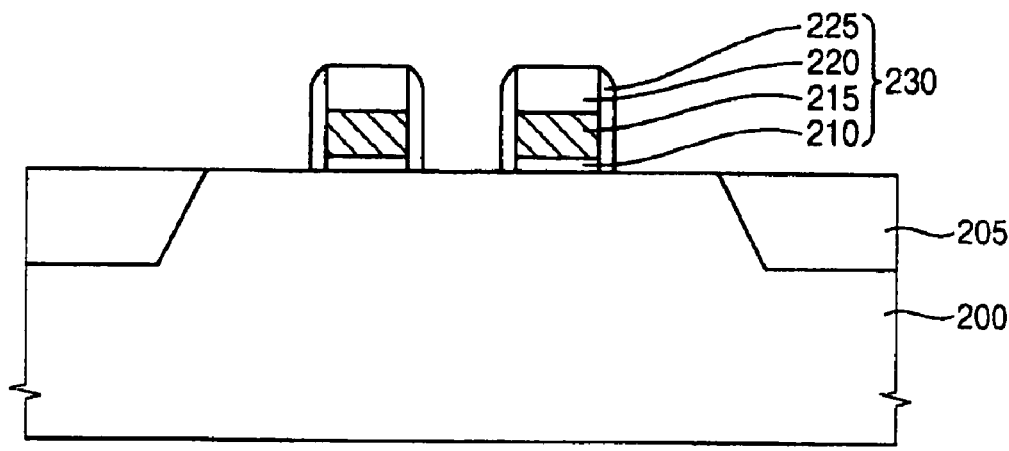

FIGS. 3A-3F are cross-sectional views illustrating a method of manufacturing a phase-change memory device in accordance with some example embodiments. Referring to FIG. 3A, an isolation layer 205 may be formed on a substrate 200 by performing an isolation process. The substrate 200 may be a semiconductor substrate or a single crystalline metal oxide substrate. In example embodiments, the isolation layer 205 may be formed of an oxide. For example, the isolation layer 205 may be formed by an STI process or a thermal oxidation process. As the isolation layer 205 may be formed on the substrate 200, an active region (not shown) and a field region (not shown) may be defined in the substrate 200.

A gate insulation layer (not illustrated), a gate conductive layer (not illustrated) and a gate mask layer (not illustrated) may be sequentially formed on the substrate 200. The gate insulation layer may be formed using an oxide and/or a metal oxide. For example, the gate insulation layer may be formed using silicon oxide, aluminum oxide, zirconium oxide, hafnium oxide, or tantalum oxide. The gate conductive layer may be formed using polysilicon doped with impurities, a metal and/or a conductive metal nitride. For example, the gate conductive layer may be formed using doped polysilicon, tungsten, aluminum, copper, titanium, tantalum, tungsten nitride, aluminum nitride, titanium nitride, tantalum nitride and/or titanium aluminum nitride. The gate mask layer may be formed using a material having an etching selectivity relative to the gate insulation layer and the gate conductive layer. For example, the gate mask layer may be formed using silicon nitride and/or silicon oxynitride.

The gate mask layer, the gate conductive layer and the gate insulation layer may be sequentially patterned by performing a photolithography process to form a gate mask 220, a gate conductive layer pattern 215 and a gate insulation layer pattern 210 on the active region of the substrate 200. In example embodiments, the gate mask layer may be etched to form the gate mask 200 on the gate conductive layer, and the gate conductive layer and the gate insulation layer may be patterned using the gate mask 220 as an etching mask to form the gate conductive layer pattern 215 and the gate insulation layer pattern 210.

An insulation layer (not illustrated) may be formed on the substrate 200 to cover the gate mask 220, and the insulation layer may be partially etched to form a gate spacer 225 on sidewalls of the gate insulation layer pattern 210, the gate conductive layer pattern 215 and the gate mask 220. Accordingly, a gate structure 230 may be formed on the active region of the substrate 100. The gate structure 230 may include the gate insulation layer pattern 210, the gate conductive layer pattern 215, the gate mask 220 and the gate spacer 225.

Figure 3B:
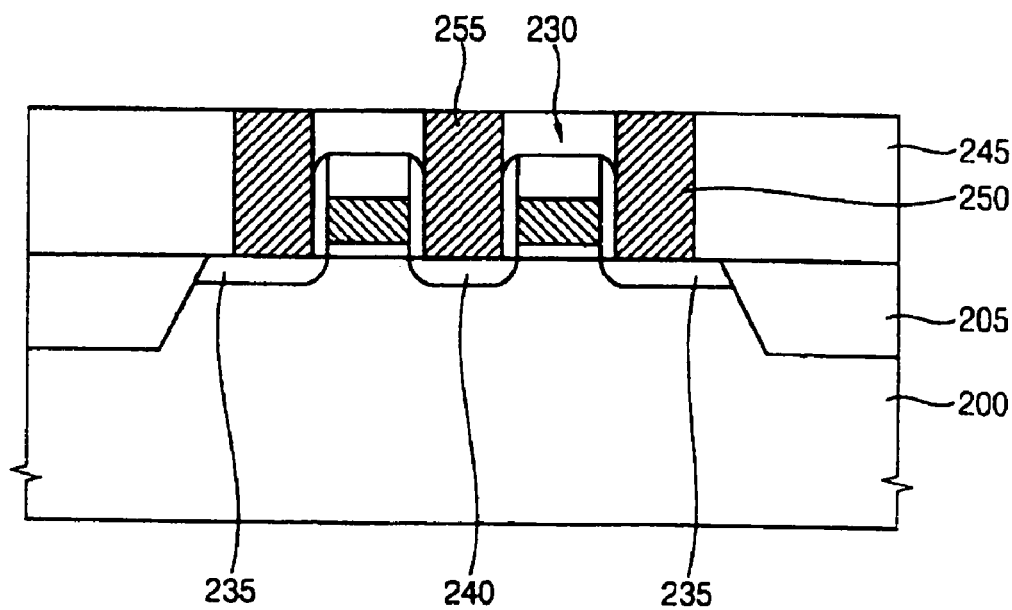

Referring to FIG. 3B, an ion implantation process may be carried out using the gate structure 230 as a mask to form a first contact region 235 and a second contact region 240 both of which may be adjacent to the gate structure 230. The first contact region 235 may be electrically connected to a lower electrode 260 (see FIG. 3D), and the second contact region 240 may be electrically connected to a lower wiring 265 (see FIG. 3D).

A lower insulating interlayer 245 may be formed on the substrate 200 to cover the gate structure 230. The lower insulating interlayer 245 may be formed by depositing an oxide by a CVD process, a PECVD process, an LPCVD process and/or an HDP-CVD process. For example, the lower insulating interlayer 215 may be formed using silicon oxide, e.g., PSG, BPSG, USG, SOG, TEOS, PE-TEOS, FOX and/or HDP-CVD oxide. These may be used alone or in a combination thereof. In example embodiments, an upper portion of the lower insulating interlayer 215 may be planarized by performing a CMP process and/or an etch-back process.

The lower insulating interlayer 245 may be partially etched by a photolithography process to form a first contact hole (not illustrated) exposing the first contact region 235 and a second contact hole (not illustrated) exposing the second contact region 240 in the lower insulating interlayer 245.

A first lower conductive layer (not illustrated) may be formed on the lower insulating interlayer 245 to fill the first and the second contact holes. The first lower conductive layer may be formed using a metal, a conductive metal nitride or doped polysilicon. For example, the lower conductive layer may be formed using tungsten, aluminum, copper, titanium, tantalum, tungsten nitride, aluminum nitride, titanium nitride, tantalum nitride or titanium aluminum nitride. The first lower conductive layer may be formed by a sputtering process, a CVD process, an LPCVD process, an atomic layer deposition (ALD) process, an electron beam deposition process or a pulse laser deposition process.

The first lower conductive layer may be partially removed until the lower insulating interlayer 245 may be exposed to form a first pad 250 filling the first contact hole and a second pad 255 filling the second contact hole. The first pad 250 may be formed on the first contact region 235, and the second pad 255 may be formed on the second contact region 240.

Figure 3C:
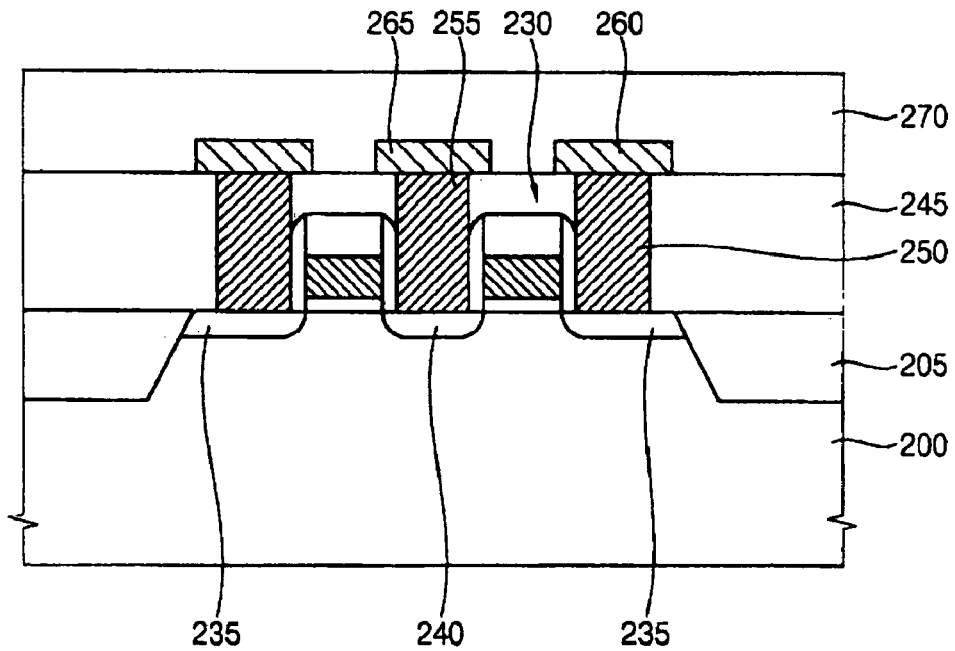

Referring to FIG. 3C, a second lower electrode (not illustrated) may be formed on the first pad 250, the second pad 255 and the lower insulating interlayer 245. The second lower conductive layer may be formed using a metal, a conductive metal nitride or doped polysilicon. For example, the second conductive layer may be formed using tungsten, aluminum, copper, tantalum, titanium, molybdenum, tungsten nitride, aluminum nitride, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride or combinations thereof. The second conductive layer may be formed by a sputtering process, a CVD process, an LPCVD process, an ALD process, an electron beam deposition process and/or a pulse laser deposition process.

The second conductive layer may be patterned by performing a photolithography process to form a lower electrode 260 and a lower wiring 265 on the first and the second pads 250 and 255, respectively. The lower electrode 260 may be electrically connected to the first contact region 235 through the first pad 250, and the lower wiring 265 may be electrically connected to the second contact region 240 through the second pad 255. In example embodiments, the lower wiring 265 may be a bit line. In example embodiments, the lower electrode 260 and the lower wiring 265 may have widths substantially greater than widths of the first pad 250 and the second pad 255.

An insulation layer 270 may be formed on the lower insulating interlayer 245 to cover the lower electrode 260 and the lower wiring 265. The insulation layer 270 may be formed using an insulation material, e.g., silicon oxide, silicon oxynitride, silicon nitride, metal oxide or combinations thereof. In example embodiments, the insulation layer 270 may be formed using silicon oxide, e.g., PSG, BPSG, USG, SOG, TEOS, PE-TEOS, FOX or HDP-CVD oxide. The insulation layer 270 may be formed by a CVD process, a PECVD process, an LPCVD process and/or an HDP-CVD process. In example embodiments, an upper face of the insulation layer 270 may be planarized by a CMP process and/or an etch-back process. The insulation layer 270 may be formed using an insulation material the same as or different from that of the lower insulating interlayer 245.

Figure 3D:
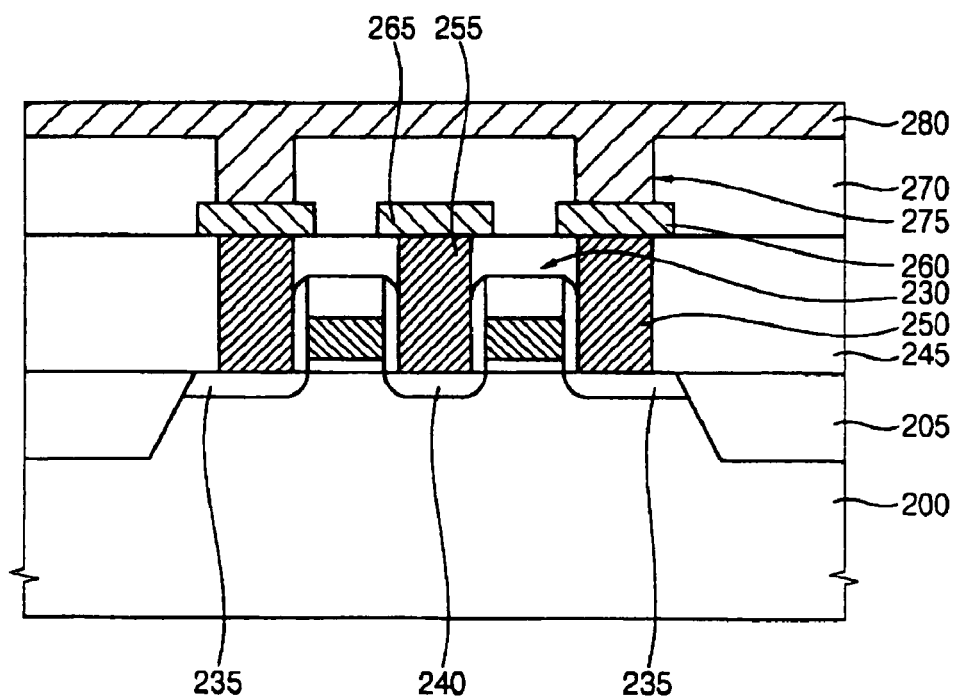

Referring to FIG. 3D, the insulation layer 270 may be partially etched by a photolithography process to form an opening 275 that passes through the insulation layer 270 to expose the lower electrode 260. For example, the opening 275 may be formed by an isotropic etching process.

A phase-change material layer 280 may be formed on the insulation layer 270 and the exposed lower electrode 260 to fill the opening 275. The phase-change material layer 280 may be formed using a chalcogenide compound or a doped chalcogenide compound. For example, the phase-change material layer 280 may be formed using a chalcogenide compound, e.g., germanium-antimony-tellurium (Ge—Sb—Te; GST), or a chalcogenide compound doped with carbon, nitrogen or a stabilizing metal. The phase-change material layer 280 may be formed by a sputtering process or a CVD process. A formation of the phase-change material layer 280 may be the same as the method described with reference to FIG. 2A.

Figure 3E:
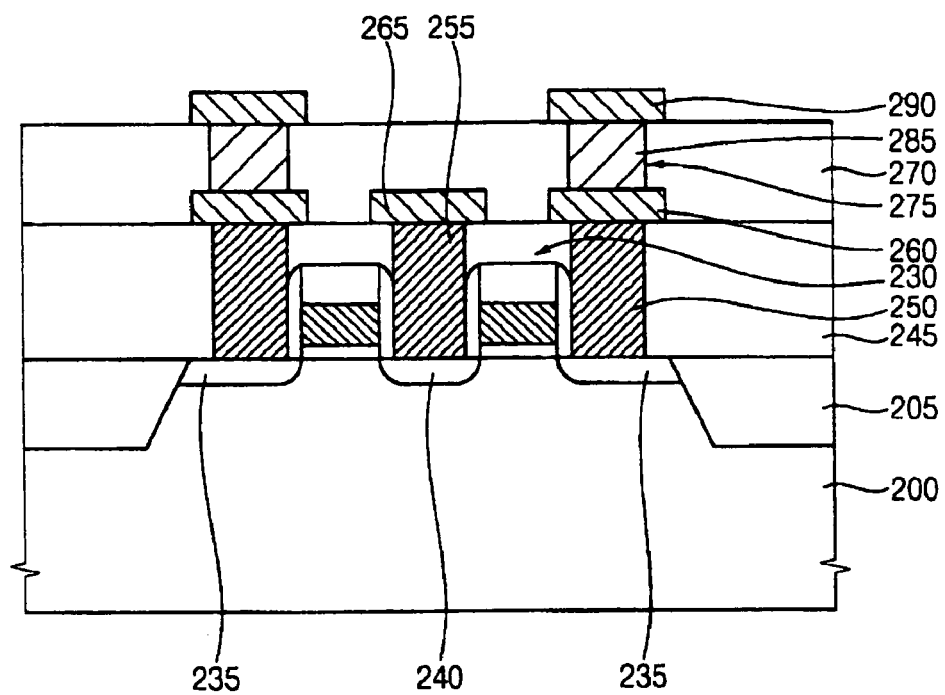

Referring to FIG. 3E, a first polishing process and a second polishing process may be sequentially performed on the phase-change material layer 280 to form a phase-change material layer pattern 285 filling the opening 275. The first polishing process may be carried out using a first slurry composition that may have a high polishing selectivity. The first slurry composition may selectively polish or remove the phase-change material layer 280 relative to the insulation layer 270. The first polishing process may be performed until an upper face of the insulation layer 270 may be partially exposed or until a portion of the phase-change material layer 280 may remain on the upper face of the insulation layer 270. Accordingly, a bulk portion or an upper portion of the phase-change material layer 280, which may be positioned on or over an upper face of the insulation layer 270, may be removed by the first polishing process.

After the bulk portion of the phase-change material layer 280 may be removed, the second polishing process may be performed on the remaining portion of the phase-change material layer 280 to form the phase-change material layer pattern 285 to fill the opening 275. The second polishing process may be carried out using a second slurry composition that may have a low polishing selectivity. As compared with the first slurry composition, the second slurry composition may have a reduced or low polishing rate for the phase-change material layer 280, whereas the second slurry composition may have a similar polishing rate for the insulation layer 270. Accordingly, the second slurry composition may polish the phase-change material layer 280 with a reduced selectivity relative to the insulation layer 270. While the second polishing process may be performed, in example embodiments, the remaining portion of the phase-change material layer 280, which may remain on the upper face of the insulation layer 270, may be removed from the insulation layer 270. In example embodiments, an upper portion of the insulation layer 270 may be partially removed, and/or a surface oxide layer, which is formed on an upper surface of the phase-change material layer 280, may be removed. As a result, the phase-change material layer pattern 285 and the insulation layer 270, both of which may have planarized flat upper faces, may be obtained. The first and the second polishing processes and the first and the second slurry compositions may be substantially the same as processes and compositions described with reference to FIGS. 1, 2A, 2B and 2C.

A first upper conductive layer (not illustrated) may be formed on the phase-change material layer pattern 285 and the insulation layer 270. The first upper conductive layer may be formed using a conductive material, e.g., doped polysilicon, a metal and/or a conductive metal nitride. The first upper conductive layer may be formed to have a single layer or a multi-layer. The first upper conductive layer may be formed by a sputtering process, a CVD process, an ALD process, an electron beam deposition process and/or a pulse laser deposition process.

In example embodiments, the first upper conductive layer may be formed to have a first thin film (not illustrated) including a metal and a second thin film (not illustrated) including a metal nitride on the first thin film. For example, the first thin film may be formed using aluminum, gallium, indium, titanium, chromium, manganese, iron, cobalt, nickel, zirconium, molybdenum, ruthenium, palladium, hafnium, tantalum, iridium, platinum or combinations thereof. The second thin film may be formed using aluminum nitride, gallium nitride, indium nitride, titanium nitride, chromium nitride, manganese nitride, iron nitride, cobalt nitride, nickel nitride, zirconium nitride, molybdenum nitride, ruthenium nitride, palladium nitride, hafnium nitride, tantalum nitride, iridium nitride, platinum nitride, tungsten nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride or combinations thereof.

The first upper conductive layer may be patterned by a photolithography process to form an upper electrode 290 on the phase-change material layer pattern 285. In example embodiments, the upper electrode 290 may have a width substantially greater than a width of the phase-change material layer pattern 285.

Figure 3F:
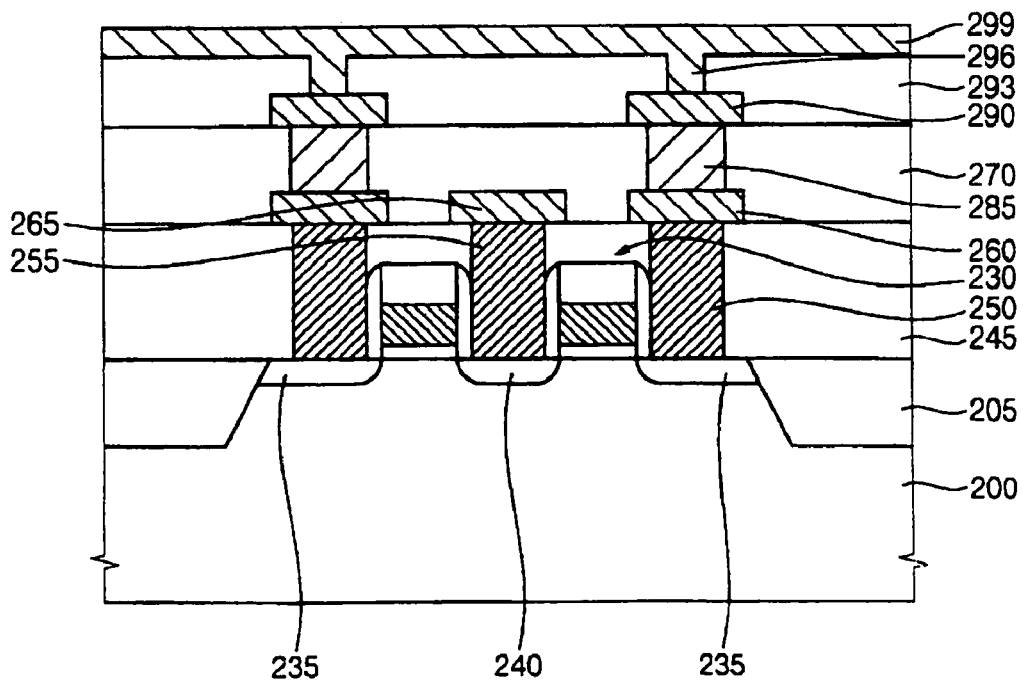

Referring to FIG. 3F, an upper insulating interlayer 293 may be formed on the insulation layer 270 to cover the upper electrode 290. The upper insulating interlayer 293 may be formed by a CVD process, a PECVD process, an LPCVD process and/or an HDP-CVD process. For example, the upper insulating interlayer 293 may formed using silicon oxide, e.g., PSG, BPSG, USG, SOG, TEOS, PE-TEOS, FOX and/or HDP-CVD oxide. In example embodiments, the upper insulating interlayer 293 may be formed using an insulation material substantially the same as those of the lower insulating interlayer 245 and/or the insulation layer 270. In example embodiments, the upper insulating interlayer 293 may be formed using an insulation material substantially different from those of the lower insulating interlayer 245 and/or the insulation layer 270.

The upper insulating interlayer 293 may be partially etched using a photolithography process to form an upper contact hole (not illustrated) that passes through the upper insulating interlayer 293 to expose the upper electrode 290. A second upper conductive layer (not illustrated) may be formed on the upper insulating interlayer 293 to fill the upper contact hole, and the second upper conductive layer may be patterned to form an upper pad 296 which may fill the upper contact hole, and an upper wiring 299 on the upper insulating interlayer 293. The upper pad 296 and the upper wiring 299 may be formed using doped polysilicon, a metal and/or a conductive metal nitride. The second upper conductive layer may be formed by a sputtering process, a CVD process, an ALD process, an electron beam deposition process or a pulse layer deposition process. In example embodiments, the upper pad 296 and the upper wiring 299 may be formed to be integrated. In example embodiments, the upper pad 296 that fills the upper contact hole may be formed, and the upper wiring 299 may be formed on the upper pad 296 and the upper insulating interlayer 293.

Figure 4A:
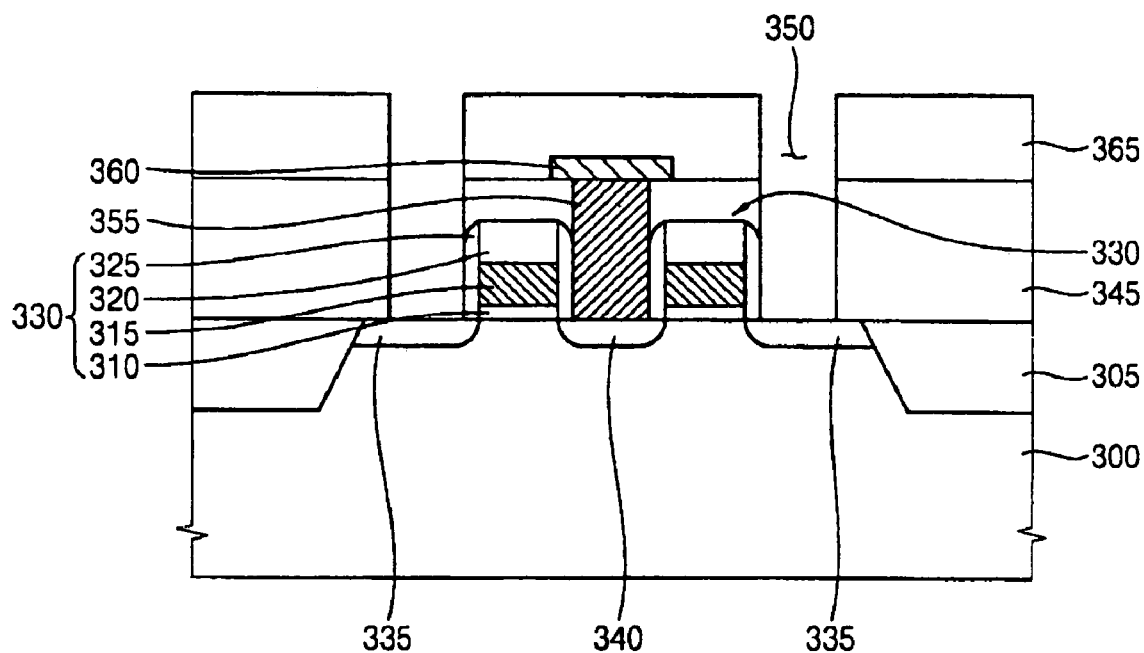
Figure 4B:
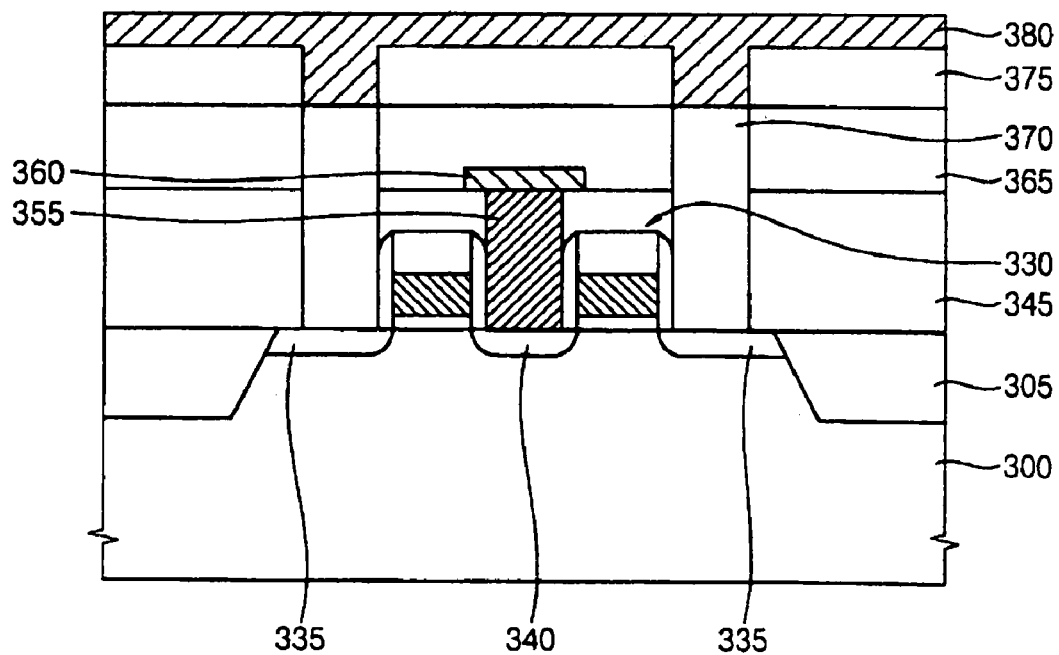
Figure 4C:
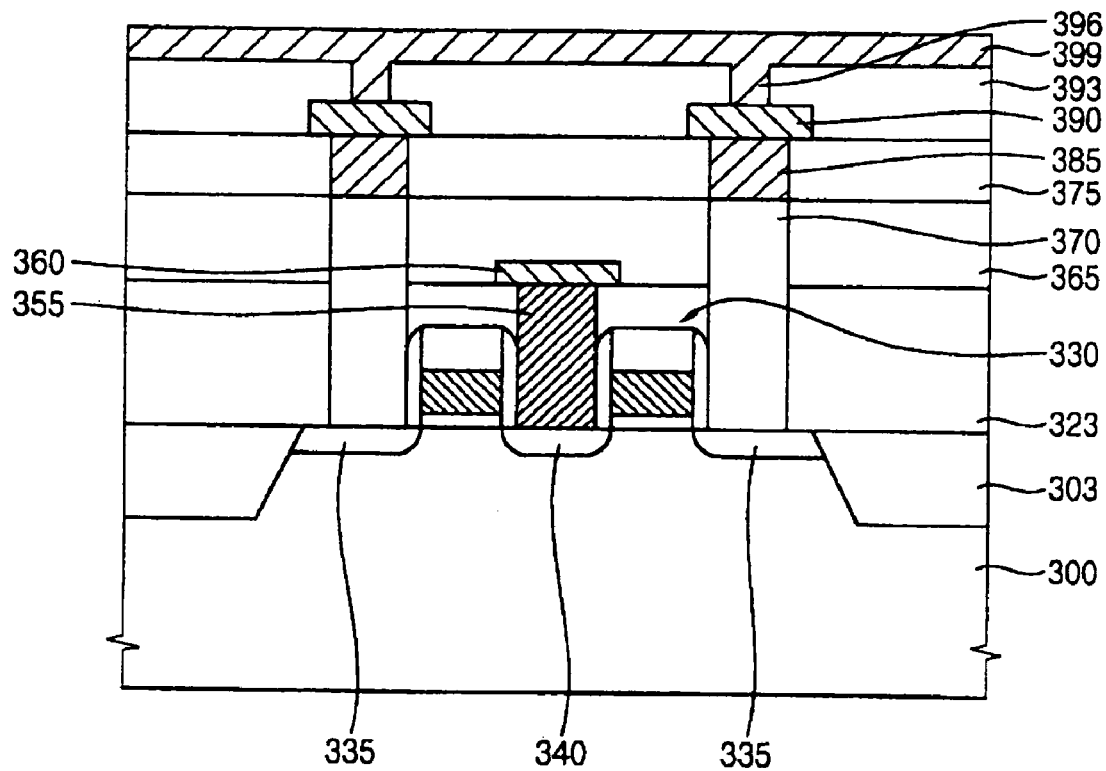

FIGS. 4A-4C are cross-sectional views illustrating a method of manufacturing a phase-change memory device in accordance with example embodiments. In FIGS. 4A-4C, processes for forming an isolation layer 305, a gate structure 330, a first contact region 335, a second contact region 340 and the first lower insulating interlayer 345 on the substrate 300 may be substantially the same as processes for forming the isolation layer 205, the gate structure 230, the first contact region 235, the second contact region 240 and the lower insulating interlayer 245 described with reference to FIGS. 3A and 3B. The gate structure 330 may be formed on an active region of the substrate 300 to have a gate insulation layer pattern 310, a gate conductive layer pattern 315, a gate mask 320 and a gate spacer 325.

Referring to FIG. 4A, the first lower insulating interlayer 345 may be partially etched by a photolithography process to form a lower contact hole (not illustrated) that may expose the second contact region 340. The first contact region 335 may not be exposed. A first lower conductive layer (not illustrated) may be formed on the first lower insulating interlayer 345 to fill the lower contact hole. A first lower conductive layer (not illustrated) may be formed on the first lower insulating interlayer 345 to fill the lower contact hole. The first lower conductive layer may be formed using doped polysilicon, a metal and/or a conductive metal nitride.

An upper portion of the first lower conductive layer may be partially removed until the first lower insulating interlayer 345 is exposed. As a result, a lower pad 355 filling the lower contact hole may be formed on the second contact region 340. The lower pad 355 may electrically connect a lower wiring 360, subsequently formed on the lower pad 355, to the second contact region 340.

A second lower conductive layer (not illustrated) may be formed on the lower pad 355 and the first lower insulating interlayer 345, and the second lower conductive layer may be patterned to form a lower wiring 360 on the lower pad 355 and the first lower insulating interlayer 345. In example embodiments, the lower pad 355 and the lower wiring 360 may be formed to be integrated. For example, a lower conductive layer (not illustrated) may be formed on the first lower insulating interlayer 345 to fill the lower contact hole, and the lower conductive layer may be patterned to form the lower pad 355 and the lower wiring 360 simultaneously.

A second insulating interlayer 365 may be formed on the first lower insulating interlayer 345 to cover the lower wiring 360. The second lower insulating interlayer 365 may be formed using an insulation material, e.g., silicon oxide. The second lower insulating interlayer 365 may be formed using an insulation material substantially the same as or different from the material of the first lower insulating interlayer 345.

The second lower insulating interlayer 365 and the first lower insulating interlayer 345 may be partially etched to form a first opening 350 that passes through the second lower insulating interlayer 365 and the first lower insulating interlayer 345 and exposes the first contact region 335.

Referring to FIG. 4B, a diode 370 may be formed on the first contact region 335 to fill the first opening 350. For example, the diode 370 may include polysilicon formed by a selective epitaxial growth (SEG) process in which the first contact region 335 may be used as a seed. In example embodiments, the diode 370 may have a height substantially the same as the summation of thicknesses of the first and the second lower insulating interlayer 345 and 365. In example embodiments, the diode 370 may have a height substantially larger or smaller than the summation of thicknesses of the first and the second lower insulating interlayer 345 and 365.

An insulation layer 375 may be formed on the diode 370 and the second lower insulating interlayer 365, and the insulation layer 375 may be partially removed to form a second opening (not illustrated) that passes through the insulation layer 375 to expose the diode 370. A phase-change material layer 380 may be formed on the exposed diode 370 and the insulation layer 375 to fill the second opening. Formation of the insulation layer 375, the second opening and the phase-change material layer 380 may be substantially the same as processes described with reference to FIGS. 3C and 3D.

Referring to FIG. 4C, a phase-change material layer pattern 385 may be formed by performing a first polishing process and a second polishing process on the phase-change material layer 380. The first polishing process may be performed on the phase-change material layer 380 using a first slurry composition having a high polishing selectivity which means that the phase-change material layer 380 may be selectively polished relative to the insulation layer 375. By performing the first polishing process, a bulk portion or an upper portion of the phase-change material layer may be removed. The second polishing process may be performed on a remaining portion of the phase-change material layer 380 and the insulation layer 375 using a second slurry composition to form the phase-change material layer pattern 385 to fill the second opening. The second slurry composition may have a low polishing selectivity which means that the phase-change material layer 380 may be less selectively polished relative to the insulation layer 375 as compared with the first slurry composition. By performing the second polishing process, the remaining portion of the phase-change material layer 380, a portion of an upper portion of the insulation layer 375, and/or a surface oxide layer (not illustrated) that may be formed on the remaining portion of the phase-change material layer 380 may be removed from the substrate 300. Accordingly, the phase-change material layer pattern 385 and the insulation layer 375 may have planarized and uniform upper faces. The first and the second polishing processes and the first and the second slurry compositions may be substantially the same as processes and compositions described with reference to FIGS. 1, 2A, 2B and 2C. Thus, any further explanation in this connection will be omitted.

A first upper conductive layer (not illustrated) may be formed on the phase-change material layer pattern 385 and the insulation layer 375. The first upper conductive layer may be patterned by a photolithography process to form an upper electrode 390 on the phase-change material layer pattern 385. An upper insulating interlayer 393 may be formed on the insulation layer 375 to cover the upper electrode 390, and the upper insulating interlayer 393 may be partially removed to form an upper contact hole (not illustrated) that passes through the upper insulating interlayer 393 to expose the upper electrode 390. A second upper conductive layer (not illustrated) may be formed on the upper insulating interlayer 393 to fill the upper contact hole, and the second upper conductive layer may be patterned to form an upper pad 396 that fills the upper contact hole and an upper wiring 399 formed on the upper insulating interlayer 393. The upper electrode 390, the upper insulating interlayer 393, the upper pad 396 and the upper wiring 399 may be formed by processes substantially the same as those described with reference to FIGS. 3E and 3F.

Example embodiments will be described with reference to Examples regarding preparation of slurry compositions and polishing experiments, hereinafter. However, Examples and experiments may be illustrative of example embodiments and may be not to be construed as limiting thereof.

Preparation of Slurry Compositions for Polishing a Phase-Change Material Layer

EXAMPLE 1

A slurry composition was prepared by mixing about 3.5 wt % of colloidal silica, about 3 wt % of citric acid, about 0.2 wt % of hydrogen peroxide, about 0.2 wt % of benzotriazole and a remaining amount of deionized water, and by adding a pH-controlling agent, e.g., hydrochloric acid, to the mixture until the pH of the composition was about 4.0.

EXAMPLES 2 THROUGH 7

Slurry compositions were prepared by performing a process substantially the same as that of Example 1, except that amounts of the abrasive, citric acid, hydrogen peroxide and benzotriazole were changed. The amounts of the abrasive, citric acid, hydrogen peroxide and benzotriazole are shown in Table 1. The unit of the amount is percent by weight.

TABLE 1

|  | Silica | Citric Acid | Hydrogen Peroxide | Benzotriazole |
| --- | --- | --- | --- | --- |
| Example 1 | 3.5 | 3 | 0.2 | 0.2 |
| Example 2 | 3.5 | 3 | 0.1 | — |
| Example 3 | 3.5 | 3 | 0.2 | — |
| Example 4 | 1 | 0.5 | 0.2 | — |
| Example 5 | 1 | 0.5 | 0.2 | 0.1 |
| Example 6 | 1 | 0.5 | 0.2 | 0.2 |
| Example 7 | 1 | 0.5 | 0.2 | 0.3 |

Evaluation of Polishing Rates and Polishing Selectivity

A polishing process was performed on a phase-change material layer and a silicon oxide layer using each of the slurry compositions prepared in Examples 1 through 7 to evaluate polishing selectivities of the slurry compositions.

The phase-change material layer was formed on a silicon wafer by performing a CVD process using germanium-antimony-tellurium (GST). The phase-change material layer was formed to have a thickness of about 800 Å. Further, an insulation layer was formed on a silicon wafer by performing a CVD process using silicon oxide. The insulation layer was formed to have a thickness of about 5,000 Å.

A CMP process was performed on the phase-change material layer and the insulation layer using each of the slurry compositions prepared in Examples 1 through 7, and polishing rates were obtained by measuring thickness differences before and after the CMP process using four points probe. The CMP process was carried out using an EBARA polishing apparatus. In the CMP process, a rotational speed of a polishing pad was about 25 rpm, a rotational speed of a polishing head supporting the silicon wafer, was about 20 rpm, a down pressure was about 100 hPa, a back pressure was about 50 hPa, and a flow rate of a slurry composition was about 100 mL/min. Results of the measured polishing rates and polishing selectivities are shown in Table 2. In Table 2, the unit of the polishing rate is Å/min and the unit of the amount is percent by weight (wt %).

TABLE 2

| Composition | Abrasive | Azole | Oxidizing Agent | Polishing Rate GST | Polishing Rate SiO₂ | Polishing Selectivity (GST/SiO₂) |
|---|---|---|---|---|---|---|
| Example 1 | 3.5 | 0.2 | 0.2 | 790 | 414 | 1.91 |
| Example 2 | 3.5 | 0 | 0.1 | 218 | 413 | 0.5 |
| Example 3 | 3.5 | 0 | 0.2 | >2,200 | 359 | >6.12 |
| Example 4 | 1 | 0 | 0.2 | >2,100 | 186 | >11.3 |
| Example 5 | 1 | 0.1 | 0.2 | 730 | 172 | 4.24 |
| Example 6 | 1 | 0.2 | 0.2 | 799 | 170 | 4.7 |
| Example 7 | 1 | 0.3 | 0.2 | 557 | 185 | 3.01 |

As shown in Table 2, when the amount of the inorganic abrasive was about 1 wt %, the polishing rate of the silicon oxide layer was below about 250 Å/min, e.g., about 170 Å/min (Example 6), about 172 Å/min (Example 5), about 185 Å/min (Example 7) and about 186 Å/min (Example 4). When the amount of the inorganic abrasive was about 3.5 wt %, the polishing rate of the silicon oxide layer was faster than about 300 Å/min, e.g., about 359 Å/min (Example 3), about 413 Å/min (Example 2) and about 414 Å/min (Example 1). It may be noted that the slurry composition having about 3.5 wt % of the abrasive may have a polishing rate of the silicon oxide layer at least about twice faster than that of the slurry composition having about 1 wt % of the abrasive.

A slurry composition having a high polishing selectivity, which means a selective removal of the phase-change material layer relative to the silicon oxide layer, may be obtained by reducing the polishing rate of the silicon oxide layer. Accordingly, in example embodiments, the slurry composition having a high polishing selectivity may include the inorganic abrasive in an amount of less than about 2 wt %, less than about 1.8 wt % or less than about 1.5 wt %, which may be smaller than about 3.5 wt %. Additionally, a slurry composition having a low polishing selectivity, which means a less selective removal of the phase-change material layer relative to the silicon oxide layer, may be prepared by increasing the polishing rate of the silicon oxide layer. Therefore, in example embodiments, the slurry composition having a low polishing selectivity may include the inorganic abrasive in an amount greater than about 2 wt %, greater than about 2.1 wt %, greater than about 2.2 wt % or greater than about 2.5 wt %, which may be larger than about 1 wt %.

Further, polishing rates obtained by the slurry compositions of Examples 4 through 7, which may include the same amount (about 1 wt %) of the inorganic abrasive and different amount (about 0~about 0.3 wt %) of the azole compound, were compared with each other. As the amount of the azole compound increased from about 0 wt % to about 0.3 wt %, the polishing rate of the silicon oxide layer was not substantially changed, whereas the polishing rate of the phase-change material layer was reduced. The slurry composition including no azole compound, prepared in Example 4, exhibited a relatively fast polishing rate of the phase-change material layer, e.g., higher than about 2,100 Å/min. However, the slurry composition including about 0.1~0.3 wt % of the azole compound, prepared in Examples 5 through 7, showed a relatively low polishing rate of the phase-change material layer, which was lower than about 1,000 Å/min, e.g., about 557~799 Å/min. Therefore, the azole compound may act as an agent for inhibiting polishing of the phase-change material layer. Accordingly, a slurry composition having a relatively low polishing selectivity, e.g., a relatively small difference of polishing rates between a phase-change material layer and an insulation layer, may be obtained by adding the azole compound to the slurry composition to reduce the polishing rate of the phase-change material layer. In example embodiments, the slurry composition having the lower polishing selectivity may include the azole compound in an amount range of about 0.01~about 10 wt %. In example embodiments, the slurry composition having the lower polishing selectivity may include the azole compound in an amount range of about 0.05~1 wt %.

The slurry composition prepared in Example 2 exhibited a relatively low polishing rate of the phase-change material layer even though the slurry composition did not include any azole compound. This result may be caused by a reduced amount of the oxidizing agent. When the amount of the oxidizing agent decreased from about 0.2 wt % to about 0.1 wt %, the polishing rate of the phase-change material layer decreased from higher than about 2,200 Å/min to about 218 Å/min. Accordingly, a slurry composition having a relatively low polishing selectivity may be obtained by reducing the amount of the oxidizing agent. In example embodiments, the slurry composition having the relatively low polishing selectivity may include the oxidizing agent in an amount less than about 0.5 wt %. However, a plurality of components of the phase-change material layer, e.g., germanium (Ge), antimony (Sb) and tellurium (Te), may exhibit reactivities to the oxidizing agent substantially different from each other. When the amount of the oxidizing agent was extremely small or near about 0 wt %, a GST layer having a non-uniform or irregular composition was obtained after performing the CMP process. In example embodiments, the slurry composition having at least about 0.01 wt % of the oxidizing agent may improve a compositional uniformity of the phase-change material layer.

According to example embodiments, a phase-change material layer pattern may be formed by performing two different polishing processes in which a first slurry composition having a higher selectivity and a second slurry composition having a lower selectivity may be sequentially employed. Accordingly, an excessive polishing of a phase-change material layer near a polishing stop point, which may be induced by the first slurry composition having a higher polishing rate of the phase-change material layer, may be prevented or reduced, and thus, formation of an unintended recess in an upper portion of the phase-change material layer pattern may be suppressed. Further, a polishing efficiency may be enhanced by removing a bulk portion of the phase-change material layer with the first slurry composition having a higher polishing rate of the phase-change material layer, as compared with performing one polishing process using only the second slurry composition having a lower selectivity and a lower polishing rate of the phase-change material layer.

Additionally, when the phase-change material layer pattern is formed by performing one polishing process using only the first slurry composition, an unintended thick surface oxide layer may be formed on the phase-change material layer pattern because the first slurry composition may have a relatively low polishing rate of an insulation layer (including a surface oxide layer). Oxygen of the surface oxide layer may also diffuse into the phase-change material layer pattern to deteriorate electrical characteristics relating to phase transition of the phase-change material layer pattern. However, the second slurry composition, which may have a relatively increased polishing rate of the insulation layer, may rapidly remove the surface oxide layer from the phase-change material layer and may also suppress a formation of such a surface oxide layer. Therefore, electrical characteristics of the phase-change material layer pattern may be improved and a generation of a defect in a phase-change memory device may be reduced.

The foregoing may be illustrative of example embodiments and is not to be construed as limiting thereof. Although a few example embodiments have been described, those skilled in the art will readily appreciate that many modifications may be possible in the example embodiments without materially departing from the novel teachings of example embodiments. Accordingly, all such modifications may be intended to be included within the scope as defined in the claims. In the claims, means-plus-function clauses may be intended to cover the structures described herein as performing the recited function and not only structural equivalents but also equivalent structures. Therefore, it may be to be understood that the foregoing may be illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a phase-change material layer pattern, comprising:
    forming an insulation layer having a recessed portion on a substrate;
    forming a phase-change material layer on the insulation layer to fill the recessed portion;
    performing a first polishing process on the phase-change material layer using a first slurry composition to partially remove the phase-change material layer, the first slurry composition having a first polishing selectivity between the insulation layer and the phase-change material layer; and
    performing a second polishing process on the phase-change material layer using a second slurry composition to form a phase-change material layer pattern in the recessed portion, the second slurry composition having a second polishing selectivity substantially lower than the first polishing selectivity.

2. The method of claim 1, wherein the first polishing selectivity between the insulation layer and the phase-change material layer is in a range of about 1:5 to about 1:1,000.

3. The method of claim 1, wherein the second polishing selectivity between the insulation layer and the phase-change material layer is in a range of about 1:0.5 to about 1:2.

4. The method of claim 1, wherein performing the second polishing process further comprises:
    removing a surface oxide layer from the phase-change material layer where the first polishing process is performed, the surface oxide layer being formed by oxidizing a surface of the phase-change material layer with the first slurry composition.

5. The method of claim 4, wherein performing the first polishing process comprises removing a bulk portion of the phase-change material layer on an upper surface of the insulation layer until a portion of the phase-change material layer remains on the upper surface of the insulation layer, and
    performing the second polishing process comprises removing the surface oxide layer and a remaining portion of the phase-change material layer on the upper surface of the insulation layer until the upper surface of the insulation layer is exposed.

6. The method of claim 4, wherein performing the first polishing process comprises removing a bulk portion of the phase-change material layer on an upper surface of the insulation layer until at least a portion of the insulation layer is exposed, and
    performing the second polishing process comprises removing the surface oxide layer, a portion of the phase-change material layer, and a portion of the insulation layer until the upper surface of the insulation layer is fully exposed.

7. The method of claim 1, wherein the first slurry composition comprises a first inorganic abrasive, a first oxidizing agent, a first organic acid and a first solvent, and the second slurry composition comprises a second inorganic abrasive, a second oxidizing agent, a second organic acid, an azole compound and a second solvent.

8. The method of claim 7, wherein the first slurry composition comprises the first inorganic abrasive in a range of about 0.1 to about 2% by weight, and the second slurry composition comprises the second inorganic abrasive in a range of about 2.1 to about 5% by weight.

9. The method of claim 7, wherein the first slurry composition comprises the first oxidizing agent in a range of about 0.12 to about 5% by weight, and the second slurry composition comprises the second oxidizing agent in a range of about 0.01 to about 0.5% by weight.

10. The method of claim 7, wherein the first slurry composition has a polishing rate of the insulation layer in a range of about 1 to about 250 Å/min, and the second slurry composition has a polishing rate of the insulation layer in a range of about 300 to about 1,000 Å/min.

11. The method of claim 7, wherein the first slurry composition has a polishing rate of the phase-change material layer in a range of about 1,000 to about 100,000 Å/min, and the second slurry composition has a polishing rate of the phase-change material layer in a range of about 150 to about 1,000 Å/min.

12. The method of claim 7, wherein the second polishing process is performed with a polishing rate of the phase-change material layer substantially slower than a polishing rate of the phase-change material layer in the first polishing process.

13. The method of claim 1, wherein forming the insulation layer includes forming at least one layer of silicon oxide, silicon oxynitride, silicon nitride, or a combination thereof.

14. The method of claim 1, wherein forming the phase-change material layer includes forming a layer of a chalcogenide compound.

15. The method of claim 1, wherein forming the insulation layer having the recessed portion comprises:
    forming a lower electrode on the substrate;
    forming the insulation layer on the lower electrode; and
    partially removing the insulation layer to form a contact hole in the insulation layer, the contact hole exposing the lower electrode.

16. The method of claim 15, further comprising:
    forming an upper electrode on the phase-change material layer pattern.

17. The method of claim 1, wherein forming the insulation layer having the recessed portion comprises:
    forming a diode on the substrate;
    forming the insulation layer on the diode; and
    partially removing the insulation layer to form an opening in the insulation layer, the opening exposing the diode.

18. The method of claim 1, wherein the first slurry composition comprises a first inorganic abrasive in an amount substantially less than an amount of a second inorganic abrasive included in the second slurry composition.

19. The method of claim 18, wherein the second polishing process is performed with a polishing rate of the insulation layer substantially faster than a polishing rate of the insulation layer in the first polishing process.

20. The method of claim 19, wherein performing the second polishing process further comprises:

removing a surface oxide layer from the phase-change material layer where the first polishing process is performed, the surface oxide layer being formed by oxidizing a surface of the phase-change material layer with the first slurry composition.

* * * * *